US009129967B2

(12) United States Patent
Tsai et al.

(10) Patent No.: US 9,129,967 B2
(45) Date of Patent: Sep. 8, 2015

(54) INTEGRATED CIRCUIT DEVICE HAVING A COPPER INTERCONNECT

(71) Applicant: TAIWAN SEMICONDUCTOR MANUFACTURING COMPANY, LTD., Hsin-Chu (TW)

(72) Inventors: Cheng-Hsiung Tsai, Chunan Town, Miaoli County (TW); Chung-Ju Lee, Hsinchu (TW); Tsung-Min Huang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 200 days.

(21) Appl. No.: 13/668,837

(22) Filed: Nov. 5, 2012

(65) Prior Publication Data

US 2014/0124932 A1 May 8, 2014

(51) Int. Cl.
*H01L 21/4763* (2006.01)
*H01L 23/532* (2006.01)
*H01L 21/768* (2006.01)

(52) U.S. Cl.
CPC .... *H01L 23/53233* (2013.01); *H01L 21/76802* (2013.01); *H01L 21/76834* (2013.01); *H01L 21/76885* (2013.01); *H01L 23/53238* (2013.01); *H01L 23/53295* (2013.01); *H01L 2924/0002* (2013.01)

(58) Field of Classification Search
CPC . H01L 21/768; H01L 21/76831; H01L 23/52; H01L 23/53238; H01L 2924/00; H01L 2924/0002
See application file for complete search history.

(56) References Cited

U.S. PATENT DOCUMENTS

| 2004/0248400 A1* | 12/2004 | Kim et al. | 438/633 |
| 2012/0252206 A1* | 10/2012 | Naik et al. | 438/653 |
| 2013/0069234 A1* | 3/2013 | Lee et al. | 257/751 |

* cited by examiner

*Primary Examiner* — Whitney T Moore
*Assistant Examiner* — Joseph Galvin, III
(74) *Attorney, Agent, or Firm* — Haynes and Boone, LLP

(57) ABSTRACT

A method of forming an interconnect structure of an integrated circuit including providing a first dielectric layer disposed on a semiconductor substrate. A via (or via hole) is etched in the first dielectric layer. A conductive layer including copper is formed that fills the via hole and has a first portion that is disposed on a top surface of the first dielectric layer. A trench is formed in the first portion of the conductive layer to pattern a copper interconnect line disposed on the first dielectric layer. The trench is filled with a second dielectric material. In an embodiment, a barrier layer is self-formed during the removal of a masking element used in the etching of the trench.

17 Claims, 8 Drawing Sheets

INTEGRATED CIRCUIT DEVICE HAVING A COPPER INTERCONNECT

BACKGROUND

The semiconductor integrated circuit (IC) industry has experienced rapid growth. Technological advances in IC design and material have produced generations of ICs having smaller and more complex circuits than the previous generations. In the course of IC evolution, functional density has increased, while the geometry size (e.g., technology node) has decreased. This scaling down of the fabrication process provides benefits such as increasing production efficiency. However, the scaling down has also increased the complexity of IC processing. For the advances in technology node and functional density to be realized, developments in IC fabrication are also needed.

One such advance was in the introduction of copper interconnects and damascene processing to form the interconnect structure. A typical IC requires multiple levels of metal interconnections for connecting the semiconductor devices. Performance of ICs is critically dependent upon the quality and reliability of these interconnections. Using copper as an interconnect material has advantages such as a lower relative resistive coefficient and better electro-migration performance. However, processing of copper is difficult for example, the patterning processes typical of aluminum interconnects were insufficient. Thus, the damascene procedure was developed where a trench is provided in a dielectric layer, which is subsequently filled with copper to form an interconnect. However, typical damascene processes may also provide for challenges during their fabrication such as damage of the surrounding dielectric layer, adequate filling of the trench with copper (e.g., without the presence of gaps or voids), barrier or liner layer damage, and other known issues. Thus, it is desired to have improvements in the area of formation of conductive interconnects for ICs.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
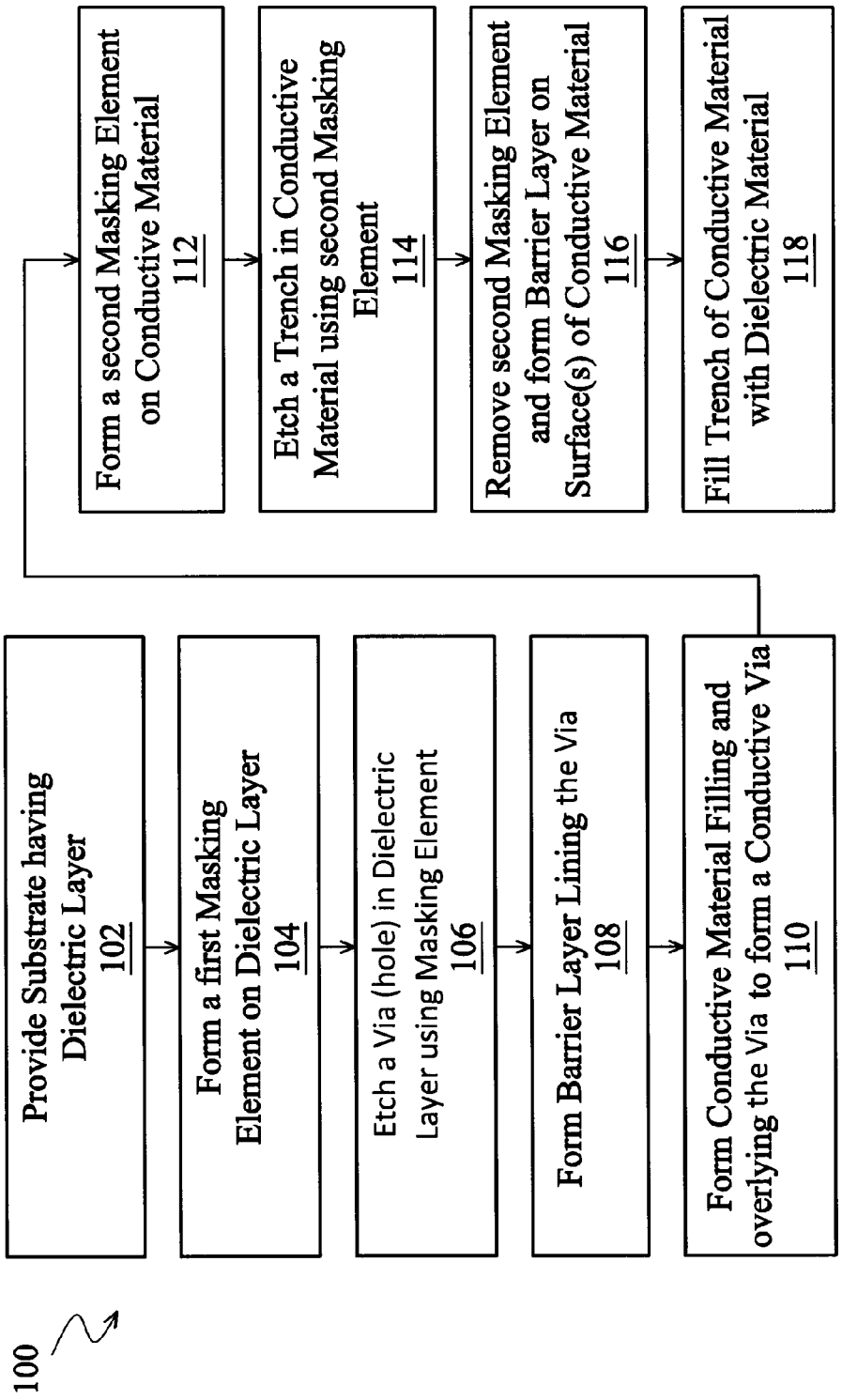
FIG. 1 is a flow chart of a method of fabricating a copper interconnect structure of an IC according to one or more aspects of the present disclosure.

Illustrated in FIG. 1 is a method of forming a copper interconnect structure ("interconnect") for a semiconductor device such as an integrated circuit. The copper interconnect structure may provide a connection to one or more semiconductor devices formed on a substrate. The interconnect structure includes a conductive line or trace and a via extending vertically to an underlying/overlying feature. It is understood that additional steps may be provided before, during and/or after the method 100. FIGS. 2-8 are cross-sectional views of a semiconductor device 200 fabricated according to the method 100 of FIG. 1.

The semiconductor device may include passive components such as resistors, capacitors, inducers, fuses and/or active devices such as p-channel field effect transistors (PFETs), n-channel transistors (NFETs), metal-oxide-semiconductor field effect transistors (MOSFETs), complementary metal-oxide-semiconductor (CMOS) transistors, high voltage transistors, high frequency transistors, and/or other suitable components or portions thereof. The interconnect structures described below may connect one or more such devices. In an embodiment, the interconnect structures of the present disclosure may provide a connection to a gate structure, a source, or a drain of a transistor; however, numerous other configurations for an interconnect structures are known and within the scope of the present disclosure including use on various "metal layers" of an IC.

The method 100 begins at block 102 where a substrate is provided. The substrate has a dielectric layer formed thereon. The dielectric layer may referred to as an inter-layer dielectric (ILD) or inter-metal dielectric (IMD) layer used for isolating interconnect structures. The dielectric layer may have a dielectric constant suitable to prevent and/or reduce capacitive coupling between adjacent interconnect structures.

The substrate may be a semiconductor substrate that includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate may be strained, may be a semiconductor on insulator (SOI) substrate, may have an epitaxial layer, and/or may have other features enhancing performance. The substrate may include any number of semiconductor device features or portions thereof, for example, transistors including gate structures, doped regions such as source/drain regions, diodes including light emitting diode (LED) structures, memory cells, sensors, microelectromechanical systems (MEMS), and the like. The substrate may include any number of layers such as conductive layers, insulating layers, etch stop layers, capping layers, diffusion/barrier layers, gate layers, hard mask layers, interfacial layers, and/or numerous other suitable layers. The dielectric layer may be formed on one or more of the previously listed layers.

The dielectric layer formed on the substrate may be a low-k dielectric layer. Exemplary materials for the dielectric layer include, but are not limited to, doped silicon dioxide such as borophosphosilicate (BPSG), phosphosilicate glass (PSG), boron doped silicon glass (BSG); un-doped silicon oxide; porous silicon dioxide; fused silica glass (FSG); organic polymers including silicon based polymers such as hydrogen silsesquioxane (HSQ) and methylsilsesquioxane (MSQ). The dielectric layer may be formed by spin-on deposition, chemical vapor deposition (CVD) including plasma-enhanced CVD (PECVD), and/or other suitable processes. The dielectric layer may be a plurality of dielectric layers having varying compositions disposed on one another.

Figure 2:
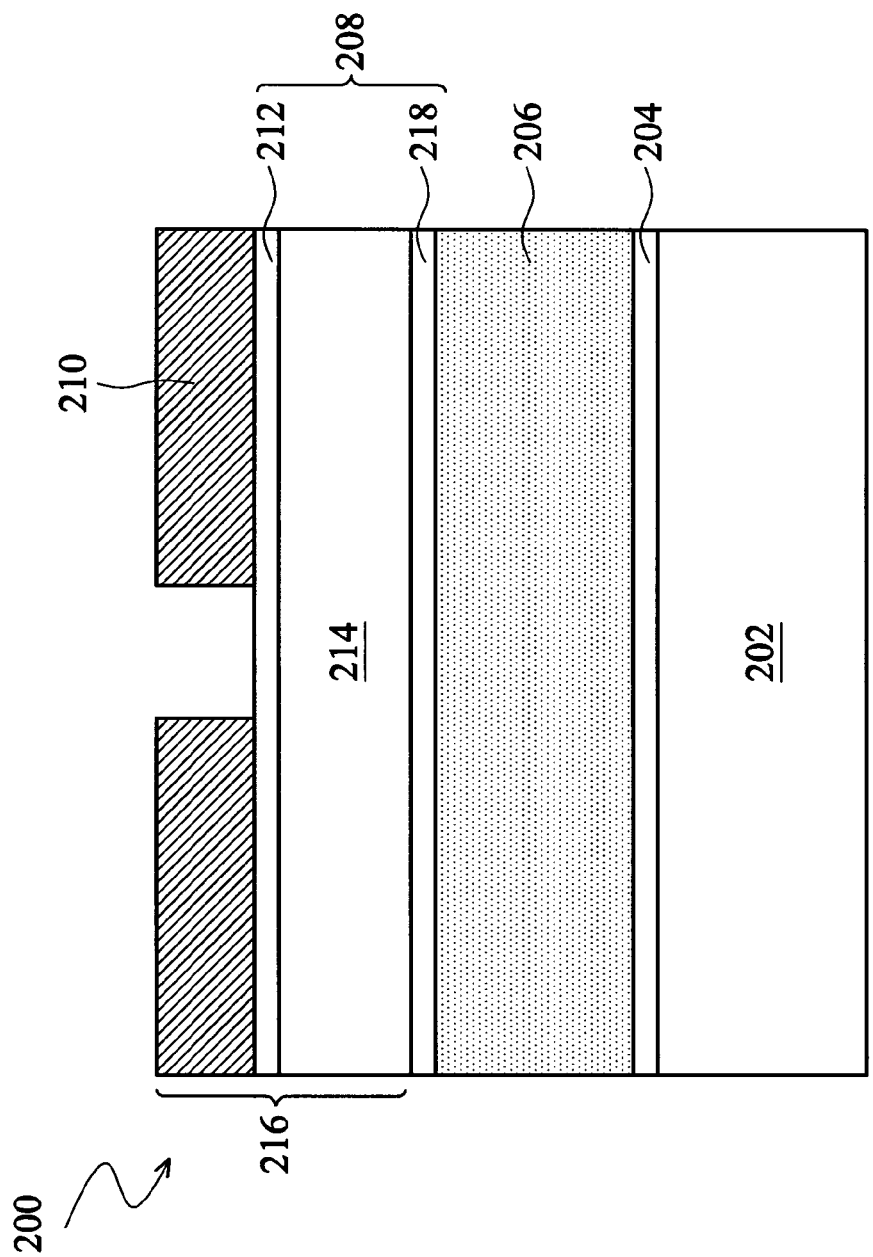
FIGS. 2-8 illustrate cross-sectional views of an embodiment of a semiconductor device fabricating according to the steps of the method of FIG. 1.

Referring to the example of FIG. 2, a device 200 includes a substrate 202, an etch stop layer 204, and a dielectric layer 206. The etch stop layer 204 is a thin film used to control the endpoint of a subsequent etch of the overlying dielectric layer 206 (described below). Exemplary materials for the etch stop layer 204 include silicon nitride, however numerous other compositions are possible. In an embodiment, the dielectric layer 206 is a low-k dielectric material such as described above.

The method 100 then proceeds to block 104 where a first masking element is formed on the dielectric layer. A masking element includes a patterned layer (e.g., photoresist) defining one or more patterns to be provided in the underlying layer(s). The first masking element may include a patterned photoresist layer defining a via (hole) to be formed in the underlying dielectric layer, as described with reference to block 106. The first masking element may define a via to be formed vertically connecting one or more features on the substrate such as, interconnect lines, gate structures, source/drain regions, plates of a capacitor, and the like. Referring to the example of FIG. 2, a masking element 208 is disposed on the dielectric layer 206. The masking element 208 includes a tri-layer photosensitive layer (tri-layer PR) 216 having a photoresist layer 210, a middle layer 212, and a bottom layer 214. A hard mask layer 218 underlies the tri-layer PR 216. Exemplary compositions of the hard mask layer 218 include nitride (e.g., SiN), amorphous carbon, metal nitride, oxide, and/or other suitable materials.

It is noted that FIG. 2 illustrates the photoresist layer 210 is patterned for example, using suitable photolithography processes. This pattern is then transferred to the underlying layers including the middle layer 212, the bottom layer 214 and the hard mask layer 218. It is noted that any suitable patterning process may be used, for example, in embodiments a tri-layer PR is not implemented.

The method 100 then proceeds to block 106 where a via (also referred to as a via hole) is formed in the dielectric layer using the first masking element, described above with reference to block 104. The via may be a hole in the dielectric layer that is subsequently filled with conductive material to provide a conductive via or trench (e.g., a vertical interconnection between features such as between conductive lines or between a conductive line and a semiconductor device), as described below. The via (hole) may be etched using suitable processes such as plasma etching. The via hole etch termination may be provided by an etch stop layer.

The first masking element may be removed using a suitable ash process concurrently with and/or subsequent to the etching of the via in the dielectric layer. After etching the via and removing the masking element, a barrier layer may be formed. The barrier layer may be disposed on the walls of the via, bottom of the via, and/or exposed portions of the top surface of the dielectric layer. In an embodiment, the barrier layer is TaN. However, other compositions of possible such as, for example, Ta, TiN, TiW, and/or other suitable compositions. The barrier layer may be provided to reduce the diffusion of subsequently formed copper into the surrounding dielectric layer.

Figure 3:
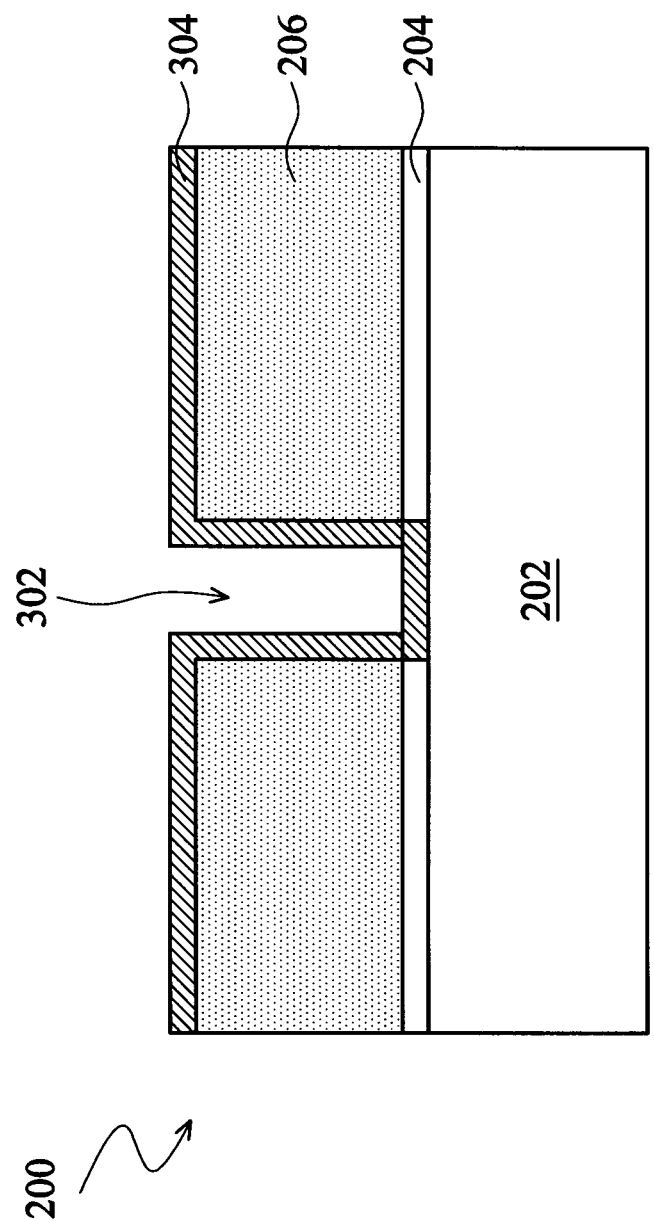

Referring to the example of FIG. 3, a via 302 (or via hole) is provided in the dielectric layer 206. The via 302 may define a hole providing a conductive via to be formed between elements on the substrate 202. The via may provide a connection path (or portion thereof) between a conductive line or trace (also referred to as a metal line) with one or more features of a device, such as a gate structure, a source/drain region, a plate of a capacitor, and the like. In an embodiment, via provides a vertical interconnection between two parallel conductive lines, one overlying the other. A barrier layer 304 is disposed on the substrate 202 including the sidewalls of the via 302. In an embodiment, the barrier layer 304 is TaN. In an embodiment, the thickness of the barrier layer 304 is approximately 50 Angstroms (Å).

The method 100 then proceeds to block 110 where a conductive material is formed on the substrate including filling the via. The conductive material filling the via (e.g., via hole) provides a conductive via providing an interconnect between features provided on different layers of the substrate. The via may interconnect a conductive line or trace (also referred to as a metal line) with one or more features of a device, such as a gate structure, a source/drain region, a plate of a capacitor, and the like. In an embodiment, the via provides a vertical interconnection between two parallel conductive lines (e.g., metal 1 and metal 2). The conductive material may be formed such that the via hole is overfilled and the conductive material is also disposed on a top surface of the dielectric layer. The thickness of the conductive material disposed on the top surface of the dielectric layer may provide the thickness of a conductive line or trace subsequently formed of the conductive material, as described below.

The conductive material includes a copper alloy. Exemplary compositions for the copper alloy include CuMn, CuCr, CuV, CuNb, CuTi, and/or other suitable compositions. In an embodiment, the copper alloy includes copper and a second metal where the second metal is between approximately 1 and approximately 5 weight percent (wt %).

In an embodiment, the conductive material includes a single layer of copper alloy material. The copper alloy may be formed by physical vapor deposition (PVD), and/or other suitable process. The copper alloy may overfill the via hole and be formed on a top surface of the dielectric layer. In an embodiment, the conductive material includes a plurality of copper alloy layers.

In another embodiment, the conductive material includes a layer of copper alloy (e.g., a seed layer) and an overlying conductive layer. The copper alloy seed layer may be formed by physical vapor deposition (PVD), and/or other suitable processes. The overlying conductive layer may be copper and formed by a suitable process such as electroplating (ECP). In an embodiment, the copper alloy seed layer may be approximately 500 Å. In an embodiment, the overlying conductive layer includes approximately 1000 Å of electroplated copper on a copper alloy seed layer.

Figure 4:
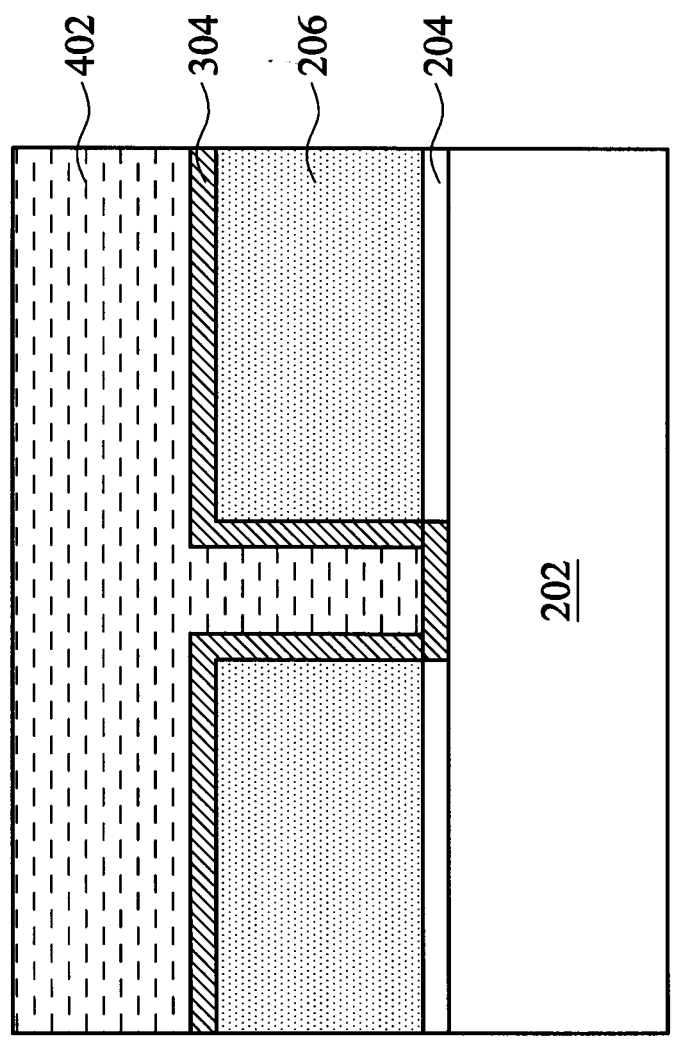
Figure 5:
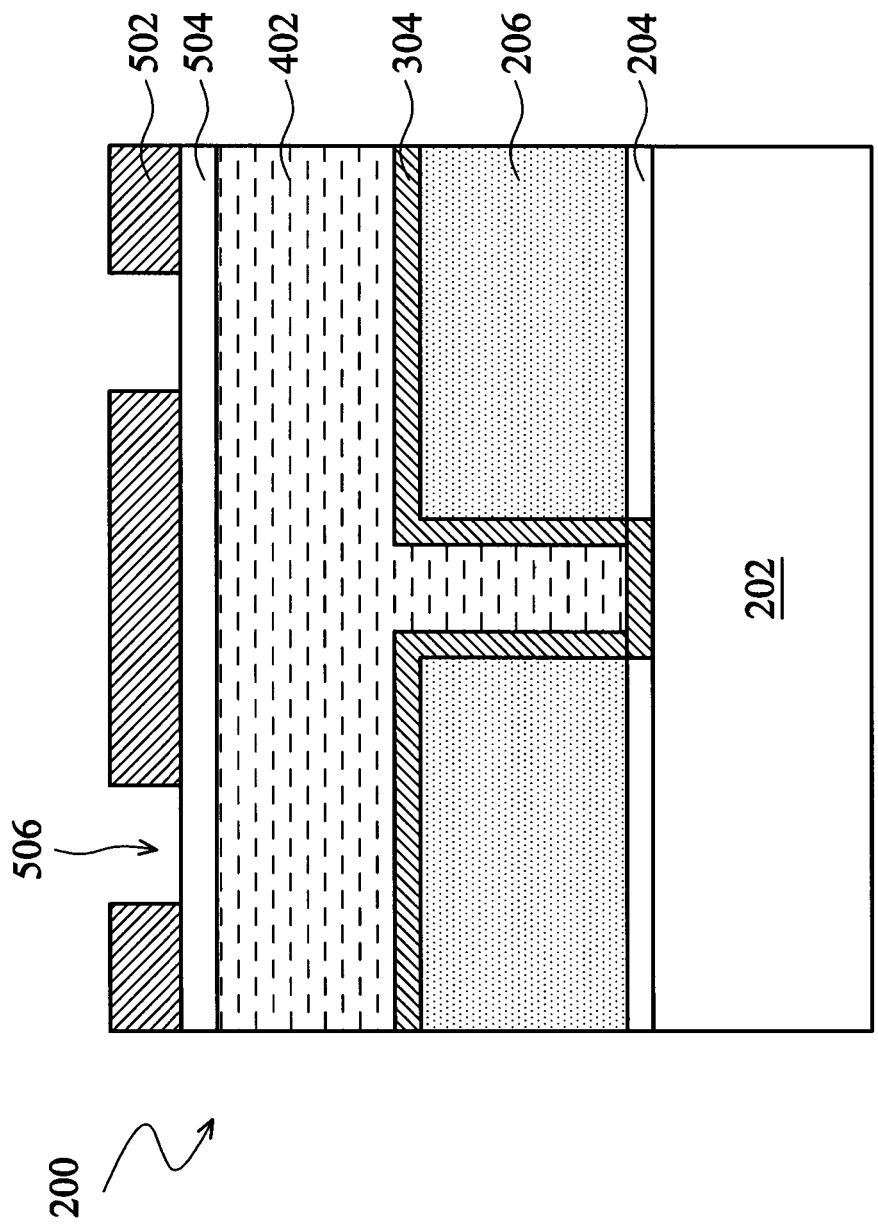
Figure 6:
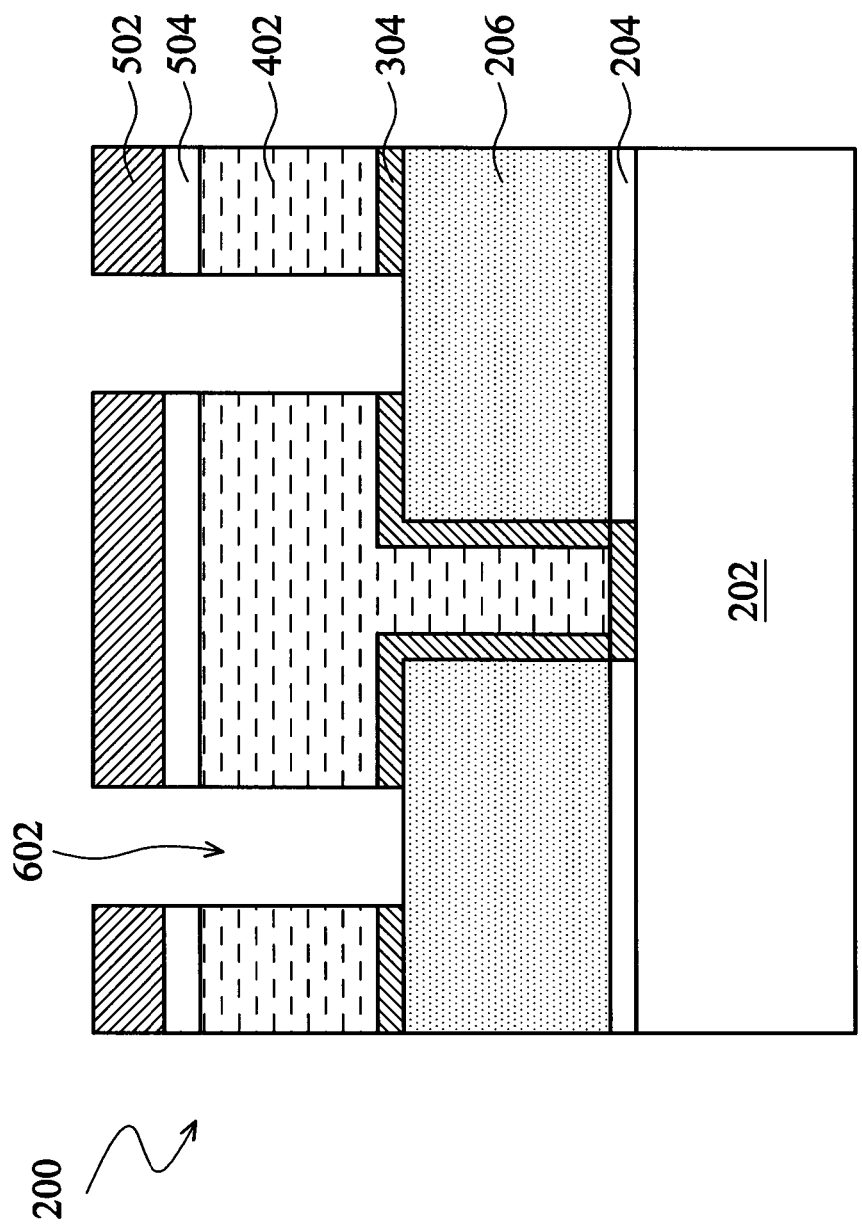

Referring to the example of FIG. 4, a conductive layer 402 is disposed on the substrate 202 including filling the via (hole) 302 and on the top surface of the dielectric layer 206. The conductive layer 402 includes copper, and at least a portion of the conductive layer 402 is a copper alloy. In an embodiment, the conductive layer 402 includes a copper alloy seed layer and an overlying copper layer. For example, the copper alloy seed layer may include a first thickness and the overlying copper layer include a second thickness (e.g., twice the thickness of the copper alloy seed layer). In another embodiment, the conductive layer 402 consists only of copper alloy material(s). Exemplary copper alloy materials included in the conductive layer 402 include CuMn, CuCr, CuV, CuNb, CuTi, and/or combinations thereof.

The method 100 then proceeds to block 112 where a second masking element is formed on the conductive material. The masking element may include hard mask layer, anti-reflective coating (e.g., bottom anti reflective coating (BARC), photosensitive layer (e.g., photoresist), and/or other suitable layers.

In an embodiment, a BARC layer is formed on the substrate for example, by spin-on coating. A photoresist material may be formed on the BARC layer, also by spin-on coating. The photoresist material may then be exposed to a pattern, for example, defined by a photomask. The exposed photoresist material is then developed, baked, rinsed, dried, and/or other suitable processes performed.

The pattern exposed to the photosensitive material of the masking element may be a pattern defining interconnect lines or traces (e.g., metal 1, metal 2, etc) for the integrated circuit. Specifically, the pattern may provide a masking element protecting the regions of the underlying conductive material required to form the desired interconnect pattern, while exposing regions designed to be between interconnect lines and thus, requiring dielectric or insulating material.

Referring to the example of FIG. 4, a photoresist 502 and a bottom antireflective coating (BARC) 504 are disposed on the conductive layer 402. The photoresist 502 defines a pattern that is used to pattern the underlying layers (BARC 504 and dielectric layer 206). The pattern provides regions 506 where dielectric or insulating material is desired between the interconnect lines formed by the pattern of the conductive layer 402.

The method 100 then proceeds to block 114 where one or more trenches are etched in the conductive material using the second masking element of block 112. The etched conductive material may provide a pattern of interconnect lines (e.g., metal 1, metal 2 . . . metal 5). The etching may be a plasma etching process. The etching of the conductive material exposes sidewalls of the conductive material having a copper alloy composition. Referring to the example of FIG. 6, trenches 602 are formed in the conductive material 402. The trenches extend to top surface of the dielectric layer 206.

The method 100 then proceeds to block 116 where the second masking element is removed and a barrier layer is formed on the conductive material. In an embodiment, block 116 is performed in a continuing process with block 114 (e.g., directly sequentially). For example, the etching of block 114 and block 116 may be performed in a single tool and/or a single chamber.

In an embodiment of block 116, a plasma etch is used to remove the masking element (e.g., photoresist) from the substrate. The plasma etch may be an oxygen plasma ash. Exemplary plasmas used for the removal of the masking element include $O_2$, $CO_2$, and/or other suitable oxygen containing plasma.

Concurrently with the plasma etch (e.g., ash) removing the second masking element, a barrier layer is formed. In other words, the barrier layer may be self-forming during the ash process. The barrier layer may be an oxide of the metal provided in the copper alloy. For example, the barrier layer may be an oxide of Mn, Cr, V, Nb, Ti, and/or other suitable metals. Exemplary compositions of the barrier layer include $Mn_xO_y$, $Cr_xO_y$, $V_xO_y$, $Nb_xO_y$, $TiO_y$, and combinations thereof. The formation of the barrier layer (concurrent with the plasma removal of the photoresist) may be provided as the second metal of the copper alloy may separate from the copper and be drawn to the sidewall of the etched trench. This movement may be attributed to the driving force induced by the plasma during the removal of the masking element (e.g., photoresist ashing). The thickness of the barrier layer may be dependent upon the weight percent of the metal in the copper alloy, the parameters of the etch process, and/or other factors. The thickness of the barrier layer may be selected such that there is an adequate thickness to prevent diffusion of copper into surrounding materials that would degrade their properties. Thickness of the barrier layer however is a trade-off between this prevention of copper diffusion and the barrier layer's thickness affecting the total resistance of the interconnect. Exemplary thicknesses of the barrier layer include thicknesses between approximately 30 Å and approximately 50 Å.

Figure 7:
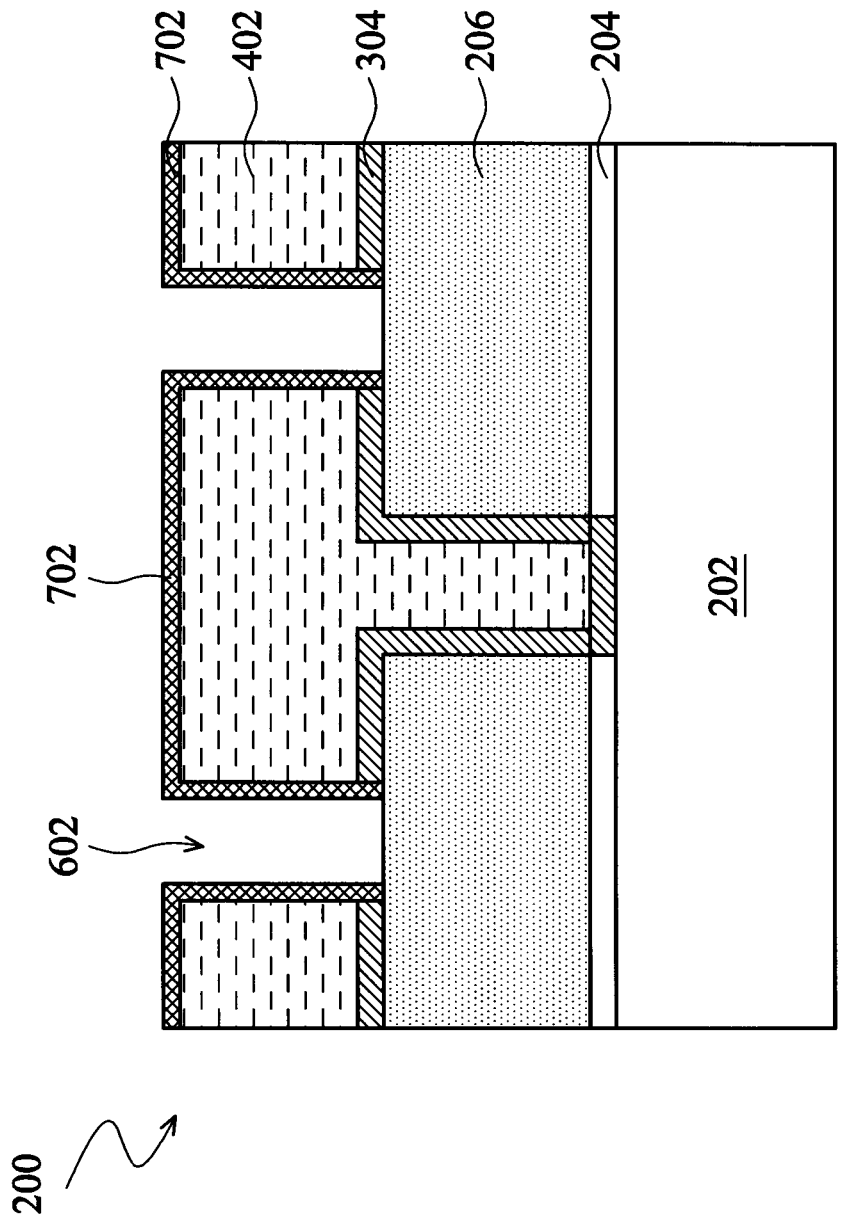

Referring to the example of FIG. 7, a barrier layer 702 is formed on the substrate 202. Specifically, the barrier layer 702 is formed on the sidewalls of the trench 602 in the conductive material 202. The barrier layer 702 may also be formed on a top surface of the conductive layer 202 after removal of the masking element including photoresist 502 and BARC 504. The barrier layer 702 is formed concurrently with the etching or ashing to remove the photoresist layer 502. The barrier layer 702 may be an oxide of the metal included in the copper alloy of the conductive layer 402. Exemplary compositions of the barrier layer 702 include $Mn_xO_y$, $Cr_xO_y$, $V_xO_y$, $Nb_xO_y$, and $TiO_y$. In an embodiment, the conductive layer 402 includes CuMn and the barrier layer includes $Mn_xO_y$. In an embodiment, the conductive layer 402 includes CuCr and the barrier layer includes $Cr_xO_y$. In an embodiment, the conductive layer 402 includes CuV and the barrier layer includes $V_xO_y$. In an embodiment, the conductive layer 402 includes CuNb and the barrier layer includes $Nb_xO_y$. In an embodiment, the conductive layer 402 includes CuTi and the barrier layer includes $Ti_xO_y$.

The method 200 then proceeds to block 118 where the trench in the conductive material, as described above with reference to block 114, is filled with dielectric material. The dielectric material may be a low-k dielectric material. Exemplary materials for the dielectric layer include doped silicon dioxide such as borophosphosilicate (BPSG), phosphosilicate glass (PSG), boron doped silicon glass (BSG); un-doped silicon oxide; porous silicon dioxide; fused silica glass (FSG); organic polymers including silicon based polymers such as hydrogen silsesquioxane (HSQ) and methylsilsesquioxane (MSQ). The dielectric layer may be formed by spin-on deposition, chemical vapor deposition (CVD) including plasma-enhanced CVD, and/or other suitable processes. The dielectric layer formed in block 118 may be the same as or different than the dielectric layer of block 102.

Figure 8:
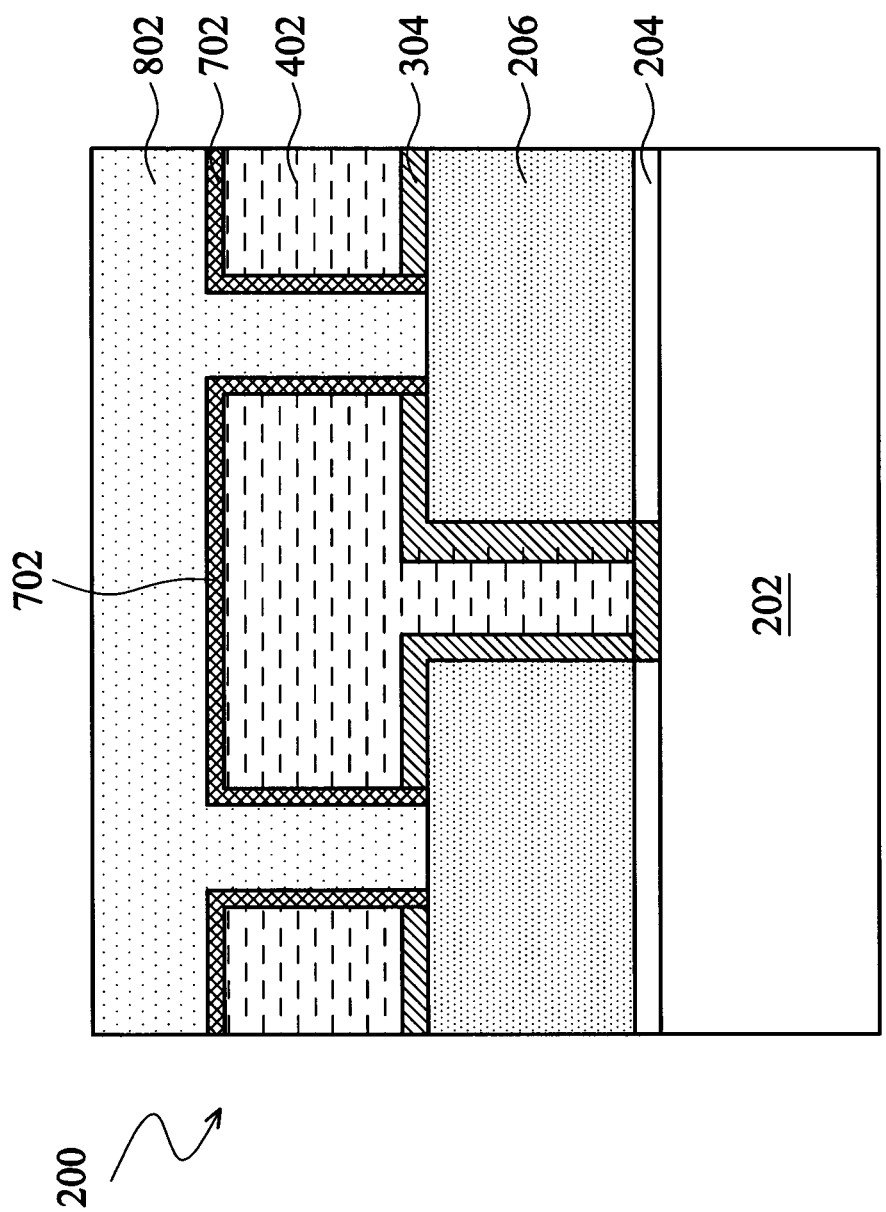

Referring to the example of FIG. 8, a dielectric layer 802 is formed in the trenches 602. The dielectric layer 802 has an interface with the barrier layer 702. The barrier layer 702 provides a barrier between the conductive material 402 and the dielectric 802. For example, the barrier layer 702 may prevent and/or reduce diffusion of the conductive material 402 into the dielectric 802. The dielectric layer 802 may be a low-k dielectric that is the same as or different than the dielectric layer 206.

Further processing of the method 100 and/or device 200 may include a chemical mechanical planarization processes, formation of additional conductive lines and vias, and/or other suitable processes. For example, in an embodiment, the dielectric layer 802 overfills the trenches 602 in the conductive material 402 and provides an ILD layer between the conductive lines patterned in the conductive material 602 and overlying layers (e.g., additional conductive lines and vias).

The method 100 may repeat any number of times. For example, in an embodiment the device 200 is processed such that multiple metal layers (e.g., 5 or more metal layers depending on the design of the IC) are formed using the method 100 of FIG. 1.

In summary, the methods and devices disclosed herein provide for a method of forming a copper interconnect and a device including a copper interconnect. In doing so, some embodiments of the present disclosure offers several advantages over prior art devices. Advantages of certain embodiments of the present disclosure include etching copper to form interconnect lines thus reducing the issues that arise from copper deposition especially in narrow aspect ratio trenches typical of a damascene process. Additional benefits include self-formation of a barrier layer while removing photoresist used to pattern the copper etching. The self-formation of the barrier layer reduces cycle time, costs and provides a quality copper etching process. It is understood that different embodiments disclosed herein offer different disclosure, and that they may make various changes, substitutions and alterations herein without departing from the spirit and scope of the present disclosure.

Thus, it will be appreciated that an embodiment of a method of forming an interconnect structure of an integrated circuit is described. In the method, a first dielectric layer is disposed on a semiconductor substrate and a via or via hole etched in the first dielectric layer. A conductive layer including copper is formed that fills the via (via hole) and has a first portion that is disposed on a top surface of the first dielectric layer. A trench is then etched in the first portion of the conductive layer to pattern a copper interconnect line disposed on the first dielectric layer. This trench is filled with a second dielectric material.

In a further embodiment, the etching the first portion of the conductive layer to form the trench includes forming a photoresist layer on the first portion of the conductive layer; patterning the photoresist layer to define the copper interconnect line; and using the patterned photoresist layer as a masking element during the etching of the trench.

In an embodiment, the conductive layer includes depositing a copper alloy selected from the group consisting of CuMn, CuCr, CuV, CuNb, CuTi and combinations thereof. The conductive layer may further comprise plating a copper material after depositing the copper alloy (e.g., by PVD).

In an embodiment, a barrier layer is formed on a sidewall of the trench after etching the first portion of the conductive layer and before filling the second trench with dielectric material. The barrier layer may include an oxide of a metal selected from the group consisting of Mn, Cr, V, Nb, Ti, and combinations thereof. The barrier layer may be formed concurrently with removing a photoresist feature disposed on the first portion of the conductive layer, wherein the photoresist feature defines the trench; forming the barrier layer may include using a plasma including oxygen.

In another embodiment described herein, a method of fabricating a semiconductor device is detailed that includes providing a substrate having a copper alloy layer disposed thereon. A photoresist pattern is formed on the copper alloy layer. The copper alloy layer is then etched using the photoresist pattern, which forms a sidewall of the copper alloy layer that is substantially perpendicular a top surface of the substrate. A plasma etch process is performed to remove the photoresist pattern; the plasma etch process forms a barrier layer on the etched copper alloy layer concurrently with the removal of the photoresist pattern. The conductive layer may be an alloy of copper and a second metal, the barrier layer an oxide of that second metal.

In a further embodiment, the barrier layer has a composition selected from the group consisting of $Mn_xO_y$, $Cr_xO_y$, $V_xO_y$, $Nb_xO_y$, $TiO_y$, and combinations thereof. Exemplary thickness of the barrier layer may be between approximately 30 Angstroms (Å) and approximately 50 Å in thickness. The copper alloy may be selected from the group consisting of CuMn, CuCr, CuV, CuNb, CuTi and combinations thereof. In a further embodiment, the conductive layer is an alloy of copper and at least approximately 1 weight percent of a second metal. The plasma etch process may include a plasma including oxygen.

In yet another embodiment, a semiconductor device is described. An interlayer dielectric (ILD) layer is disposed on a semiconductor substrate. A via formed in the ILD layer (e.g., copper via). A conductive line disposed on the ILD layer and connected to the via. The conductive line includes a copper alloy of copper and a second metal. A barrier layer is disposed on the sidewalls of the conductive line and is an oxide of the second metal.

In a further embodiment, the second metal described above is selected from the group consisting of Mn, Cr, V, Nb, Ti, and combinations thereof. In an embodiment, of the device, a second barrier layer is disposed on the sidewalls of the via. The conductive line may include a plated copper layer on the copper alloy.

What is claimed is:

1. A method of forming an interconnect structure of an integrated circuit, comprising:
   forming a conductive layer including copper, wherein the conductive layer has a first portion that is disposed on a top surface of a first dielectric layer;
   forming a patterned photoresist feature on the conductive layer defining a trench;
   etching the trench in the first portion of the conductive layer to pattern a copper interconnect line disposed on the first dielectric layer;
   performing a plasma process, thereby removing the patterned photoresist feature and forming a barrier layer on a sidewall of the trench, wherein the plasma process includes oxygen; and
   filling the trench with a second dielectric material.

2. The method of claim 1, wherein the etching the first portion of the conductive layer to form the trench includes:
   forming a photoresist layer above the first portion of the conductive layer;
   patterning the photoresist layer to define the copper interconnect line; and
   using the patterned photoresist layer as a masking element during the etching of the trench.

3. The method of claim 1, wherein the barrier layer includes an oxide of a metal selected from the group consisting of Mn, Cr, V, Nb, Ti, and combinations thereof.

4. The method of claim 1, wherein forming the conductive layer includes depositing a copper alloy selected from the group consisting of CuMn, CuCr, CuV, CuNb, CuTi and combinations thereof.

5. The method of claim 4, wherein the forming the conductive layer further comprises plating a copper material after depositing the copper alloy.

6. The method of claim 4, wherein the depositing the copper alloy includes performing a physical vapor deposition (PVD) process.

7. A method of fabricating a semiconductor device, comprising:
   providing a substrate having a copper alloy layer disposed thereon;
   forming a photoresist pattern above the copper alloy layer;
   etching the copper alloy layer using the photoresist pattern to form a sidewall of the copper alloy layer, wherein the sidewall is substantially perpendicular a top surface of the substrate; and
   performing a plasma etch process to remove the photoresist pattern and form a barrier layer on the etched copper alloy layer.

8. The method of claim 7, wherein the barrier layer has a composition selected from the group consisting of $Mn_xO_y$, $Cr_xO_y$, $V_xO_y$, $Nb_xO_y$, $TiO_y$, and combinations thereof.

9. The method of claim 8, wherein the copper alloy is selected from the group consisting of CuMn, CuCr, CuV, CuNb, CuTi and combinations thereof.

10. The method of claim 7, wherein the alloy includes copper and at least approximately 1 weight percent of a second metal.

11. The method of claim 7, wherein the plasma etch process includes a plasma including oxygen.

12. The method of claim 7, wherein the barrier layer is between approximately 30 Angstroms (Å) and approximately 50 Å in thickness.

13. The method of claim 7, wherein the copper alloy includes copper and a second metal, and wherein the barrier layer is an oxide of the second metal.

14. The method of claim 7, wherein the etching the copper alloy layer includes defining a layer of an interconnect structure on the semiconductor device.

15. A method, comprising:
providing a substrate having a conductive layer including copper disposed thereon;
forming a photoresist pattern above the conductive layer;
etching the conductive layer using the photoresist pattern as a masking element to form a via in the conductive layer, the via having a sidewall;
etching the photoresist pattern, wherein the etching is performed by a plasma process; and
forming a barrier layer on the sidewall, wherein the barrier layer is formed by the same plasma process that removes the photoresist pattern.

16. The method of claim 15, wherein the conductive layer is selected from the group consisting of CuMn, CuCr, CuV, CuNb, CuTi and combinations thereof, and wherein the forming the barrier layer includes an oxidation process of one of Mn, Cr, V, Nb, Ti and combinations thereof.

17. The method of claim 15, wherein the plasma process includes oxygen.

* * * * *